United States Patent

Juvinall

[11] 4,004,234
[45] Jan. 18, 1977

[54] ARTICLE PRESENCE SENSOR

[75] Inventor: John W. Juvinall, Toledo, Ohio

[73] Assignee: Owens-Illinois, Inc., Toledo, Ohio

[22] Filed: June 23, 1975

[21] Appl. No.: 589,633

[52] U.S. Cl. .................. 328/5; 307/308; 328/151; 340/258 C

[51] Int. Cl.² ........................ G08B 27/00

[58] Field of Search ........... 328/5; 340/258 C; 331/65; 307/308, 235 K; 324/61 R

[56] References Cited

UNITED STATES PATENTS

| | | | |
|---|---|---|---|
| 3,331,969 | 7/1967 | King | 328/5 |
| 3,644,752 | 2/1972 | Clark | 307/235 B |
| 3,778,807 | 12/1973 | Ralston | 340/258 C |

*Primary Examiner*—Stanley D. Miller, Jr.
*Assistant Examiner*—R. P. Davis
*Attorney, Agent, or Firm*—D. T. Innis; E. J. Holler

[57] ABSTRACT

Apparatus for sensing the presence of an article. One end of a very high impedance resistor is held at a fixed voltage. The other end of the resistor is connected to a sensing element. When an article is placed close enough to the sensing element, a form of capacitive coupling to ground is created which causes a minute current flow through the resistor. This causes a small voltage drop across the resistor. The current and voltage difference are presented to a voltage follower which effectively amplifies the current. Sample and hold circuits furnish a signal which indicates the actual voltage level. A minimum level detector measures the voltage level with no article present. This level is compared with the sample and hold signal, and an article present signal is generated if the sample and hold signal is a pre-selected amount greater than the minimum level.

7 Claims, 1 Drawing Figure

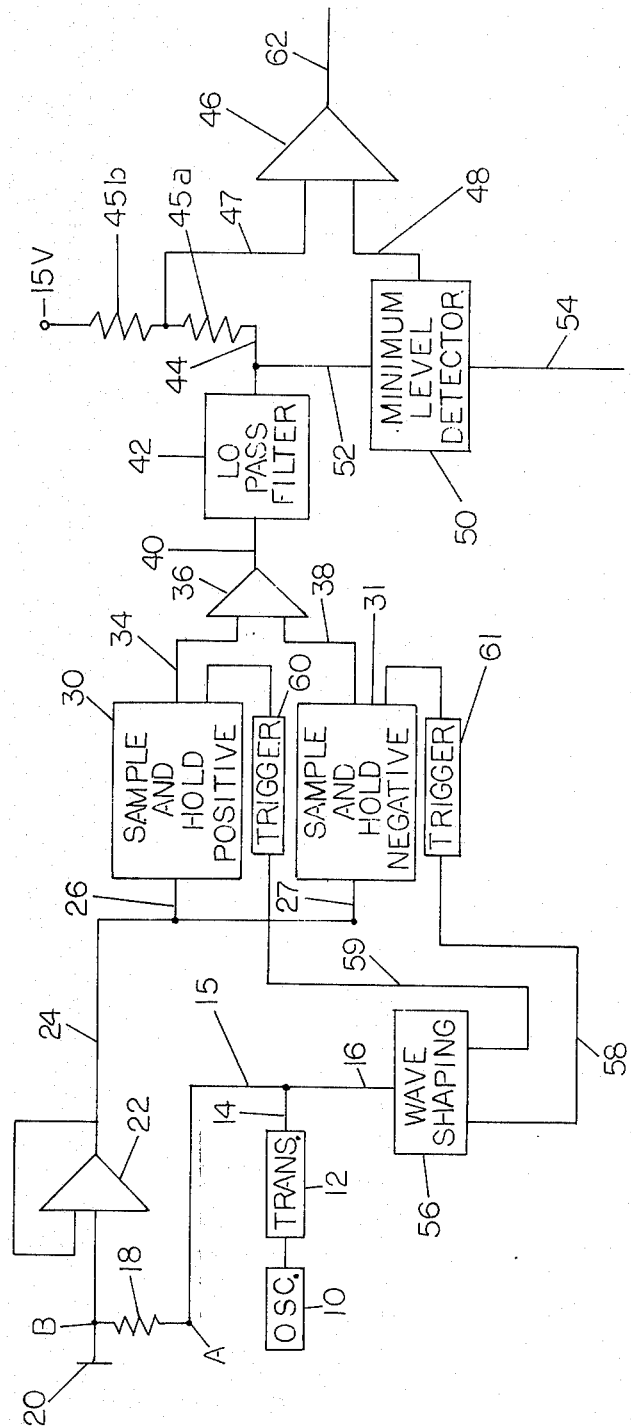

4,004,234

ARTICLE PRESENCE SENSOR

BACKGROUND OF THE INVENTION

This invention generally relates to proximity sensors. More specifically, this invention relates to such a sensor which relies on a current induced by capacitive coupling of an article to the sensor as the means for indicating the presence of an article.

Proximity or article presence sensor which depend upon a capacitive coupling effect between the sensor and the article are known in the art. A very small current is generated within the sensor as a result of this coupling. To the best of my knowledge, the sensors of the prior art have attempted to use this current, or an associated voltage drop, directly as the primary signal. This has created operating problems since circuits operating with very small currents tend to be unstable and very prone to stray electrical noise distortion. In addition, an absolute level must be established in the circuit to allow determining when the induced current is great enough to signal the presence of an article. I have overcome these problems by measuring the current rise above a variable base line as the primary signal. The minimum circuit level with no article present is measured and held. The voltage and current resulting from the presence of an article are amplified. The negative and positive peak values from the amplifier are summed. This summed value is compared with the held minimum level and an output signal is generated if the two compared values differ by more than a pre-selected amount.

SUMMARY OF THE INVENTION

My invention is an apparatus for sensing the presence of an article. The apparatus includes a source of alternating current connected to one side of a high impedance resistor. A metallic sensing element is connected to the other side of the resistor. A voltage follower circuit is connected to the same side of the resistor as the sensing element and will amplify any signal generated as a result of an article being present before the sensing element. Connected to the output of the voltage follower circuit is an electronic circuit means for furnishing an output signal quantity representative of the total range of the signal from the voltage follower circuit. Also connected to the output of the electronic circuit means is an electronic minimum level detection means for detecting and holding the minimum value presented by the electronic circuit means during a pre-selected time period. Finally, an electronic comparison means receives signals from the minimum level detection means and the electronic circuit means and generates an output signal indicative of the presence of an article in response to the output signal quantity from the electronic circuit means exceeding the minimum value by a pre-selected amount.

BRIEF DESCRIPTION OF THE DRAWINGS

The single drawing FIGURE is a block diagram of the apparatus of the present invention.

DETAILED DESCRIPTION OF THE DRAWINGS

The circuit of the present invention is illustrated in block diagram form. It should be realized that the drawing figure does not include a power supply which is necessary to activate the active elements in this circuit. Such power supply and its connections should be quite clear to those skilled in the art. The power supply typically is of the type which will furnish voltage levels of plus 15 volts and minus 15 volts. The basic operational signal is generated by an oscillator 10 which is set to furnish an alternating signal at approximately 1 kilohertz. This signal from the oscillator 10 is then transmitted to a transformer 12 which is set to give an output voltage of approximately 150 volts RMS at the 1 kilohertz frequency. The output from the transformer is carried along a conductor 14 and is split into two separate lines and carried along conductors 15 and 16. The conductor 15 is connected to one side of a very high impedance resistor 18. The resistor 18 should have a value of approximately 1,000 megohms. The other side of the resistor 18 is connected to a metallic sensing element 20 which may be a small washer or similar item. There are two specific points in the circuit which need to be considered at this time. One is a point designated as A which is the side of the resistor 18 connected to the conductor 15. The other point is a point designated as B which is the other side of the resistor 18 and is the side of the resistor 18 connected to the sensing element 20. It should be clear that under normal circumstances there will be no significant voltage drop or current flow across the resistor 18. Under these conditions the voltage at both points A and B will be 150 volts. However, when some article whose presence is to be detected is brought into proximity to the metal sensing element 20, a capacitive coupling effect occurs and there is a path presented to ground through the article near the sensing element 20. This capacitive coupling effect allows a very small current to be generated through the resistor 18. Typically, when measuring glass containers, the voltage drop across the resistor 18, assuming it has the 1,000 megohm value is approximately 5 volts. This then means that the voltage at point B then becomes 145 volts as opposed to the 150 volt level present at point A. It is this small voltage which can then be used as a measure or indication of the presence of an article before the sensing element. The smallest practical value for the resistor 18 is about 100 megohms. This will cause a voltage drop of about one-half volt when an article is sensed.

It should again be emphasized that the current flowing through the resistor 18 is truly miniscule and many problems result from trying to use or measure such very small currents even with modern sophisticated electronic devices. In particular, such small currents lead to inherent instability in the circuits which try to use them. Thus, those devices which have been known in the prior art normally include an internal trimming circuit which has an external knob which is simply turned until one obtains a proper reading with an article positioned in front of the sensing element. This of course is highly undesirable since over a period of time the elements within the circuit may drift and in addition, different instabilities within the circuit may develop which would lead to inaccurate sensing of articles presented for detection. The present circuit overcomes these problems by making the measurement of article presence on a relative basis rather than on an absolute basis which would require an initial calibration. Additionally, the measurements in the present circuit are simplified by operating the entire circuit at the 150 volt level. That is, rather than using a conventional ground, the operating level of the entire circuit is considered to be 150 volts. That is accomplished, although not shown in FIG. 1, by connecting the 150 volt output of the transformer 12 to the common-line from the power supply output. This means that all voltage levels are referenced at plus 15 or minus 15 above or below 150 volts as opposed to being above or below a true zero level. This presents no problems since the level remains consistent throughout the entire circuit and is only at the input and output points of the circuit that compensation must be made for this unusual operating level. It would of course be possible to operate the circuit in a completely conventional manner by isolating the output from the sensing element 20 through a device such as an optical isolater before entering it into the logic circuitry. However, most isolation devices tend to be quite non-linear, and therefore using such a device would add additional undesired non-linearity to a circuit whose characteristics are already relatively unstable. Therefore, keeping these factors in mind the processing of these very small current and voltage induced in across the resistor 18 will be processed in the following fashion.

The voltage, or more properly, current is amplified through an operational amplifier 22 connected to operate as a voltage follower. The operational amplifier 22 has an output conductor 24 which connects this signal to the rest of the circuit. The operational amplifier will furnish the current called for by the rest of the circuit as an amplified function of the small current induced through the resistor 18. The conductor 24 is connected to branch conductors 26 and 27 to sample and hold circuits 30 and 31. The sample and hold circuits 30 and 31 are the conventional capacitor type sample and hold circuits which are well known in the art. The circuit 30 will hold the positive going portion of the AC signal from the operational amplifier 22 while the sample and hold circuit 31 will hold the negative going portion of this signal. The output of the sample and hold circuit 30 is carried by a conductor 34 to a difference amplifier 36. Likewise, the output of the sample and hold circuit 31 is carried by a conductor 38 also to the difference amplifier 36. The output of the amplifier 36, which is carried along a conductor 40, is therefore representative of the peak to peak value of the voltage signal which is present at the time that the sample and hold units 30 and 31 take their sample. The conductor 40 is connected to a low pass filter 42 which is designed to remove extraneous noise signals from the signal carried by the conductor 40. The output of the low pass filter 42 is carried along a conductor 44 to a voltage divider made up of resistors 45a and 45b. Resistor 45a may be about 1 kilohm in value while 45b may be about 390 kilohm in value. The result is a very small reduction in the peak to peak value. This sets the comparison level such that the peak to peak value must increase above the minimum level by a set amount which is fixed by the resistor ratio. The voltage divider is connected to one input terminal of a comparator 46 by a conductor 47. A second input to the comparator 46 is from an output conductor 48 from a minimum level detector circuit 50. The minimum level detector 50 is connected to the conductor 44 from the low pass filter 42 by a branch conductor 52. The minimum level detector 50 is another conventional circuit whose purpose is to determine the minimum level reached by a signal during a particular time period and to hold this level and present it as an output along the conductor 48. Thus, the inputs to the comparator 46 are a signal along the conductor 47 representing the actual amplitude of the signal into the operational amplifier 22 and a signal along the conductor 48 which represents the absolute minimum value reached by the signal from the difference amplifier 36 during a particular time period. Thus when an article's presence is to be detected by the sensing element 20, the signal which results is referenced not to an absolute level but rather to the minimum level furnished by the minimum level detector 50 which had been detected during a time period when no articles were present.

This device has found particular utility on indexing type gauging machines such as those shown in U.S. Pat. No. 2,313,409 for the inspection of glass containers. These machines index glass containers to and from a plurality of inspection stations and inspect the glass containers for various attributes at the inspection stations. It is necessary to be sure that a glass container is present for inspection before a reading of a defective condition be accepted. Thus the apparatus of the present invention is used at the first station of these machines to determine whether or not an article is present to be inspected. This information is then loaded into a memory and transferred through the entire machine cycle with the container as it is indexed from station-to-station. These machines also will generate gauging or signal pulses once during each cycle as the container is moved from station-to-station. This pulse is transmitted along a conductor 54 to the minimum level detector for resetting the minimum level detector 50 for each inspection cycle. Because of the 150 volt reference level, the signal along the conductor 54 will have to be entered through some sort of conditioning circuit, such as an optical isolator, to remove its earth ground reference and place it on the 150 volt reference level.

The conductor 16 carries the AC signal from the oscillator 10 and transformer 12 into a wave shaping circuit 56. The wave shaping circuit 56 is a conventional transistor type wave shaping circuit which will give as outputs along conductors 58 and 59 signals which represent the positive peak and the negative peak of the AC signal. That is, there will be very sharp, discrete, square waves generated at the positive and negative peak points of the AC signal and transmitted along the conductors 58 and 59. The conductor 58 will carry the signal for the negative peak and the conductor 59 will carry the signal for the positive peak. Thus, the pulse carried by the conductor 59 will activate a transistor trigger circuit 60 which in turn will activate the sample and hold unit 30 to sample and hold the signal present at that time. This should be the positive peak value. The negative going signal peak will be transmitted along the conductor 58 and will activate a second transistor trigger circuit 61 which in turn will activate the sample and hold circuit 31 to sample the signal present at that particular time. This will be the negative going peak value and will be held until the next time the transistor circuit 61 is activated.

The circuit of the present invention will therefore act as a very sensitive yet stable proximity sensor for articles which are brought close enough to the metallic sensing element 20 to allow capacitive coupling take place and generate the small current across the resistor 18. The range for this device for dielectric articles, such as glass containers, is about three quarters of an inch. Better grounded or more conductive articles may be sensed farther away than this distance. When such an article is present a signal will be generated from the comparator 46 and transmitted along a conductor 62 where this signal may be used as an indication of the presence of an article. Again because of the 150 volt reference level, the signal on conductor 62 will have to go through some output conditioning device, such as an optical isolator, so that it may be referenced to an earth ground for further utilization. Keep in mind again that because of the constant reference of the signal to the minimum level previously sensed as opposed to an absolute and fixed level, drift and distortion of the signals within the circuit will not particularly affect the accuracy of detecting articles. This is an advance over the prior art circuits in that they did not incorporate such circuitry which would compensate for the unavoidable changes within the circuit itself during its operational life.

What I claim is:

1. Apparatus for sensing the presence of an article which comprises, in combination:
   a source of alternating current;
   a high impedance resistor of at least 100 megohms value having one side thereof connected to said source of alternating current;
   a metallic sensing element connected to the other side of said resistor;
   a voltage follower circuit, connected to the same side of said resistor as said sensing element, for amplifying any signal generated as a result of an article being present before said sensing element;
   electronic circuit means, connected to the output of said voltage follower circuit, for furnishing an output signal quantity representative of the total range of the signal from said voltage follower circuit;
   said electronic circuit means including
      first electronic means for sampling and holding the positive going peak of any electrical signal from said voltage follower;
      second electronic means for sampling and holding the negative going peak of any electrical signal from said voltage follower; and
      electronic difference means, connected to the output of both said first and second electronic means for sampling and holding, for generating an output signal quantity indicative of the peak to peak output value of said voltage follower;
   electronic minimum level detection means connected to said electronic circuit means for detecting and holding the minimum value presented by said electronic circuit means during a pre-selected time period; and
   electronic comparison means, connected to said minimum level detection means and to said electronic circuit means, for generating an output signal indicative of the presence of an article in response to said output signal from said electronic circuit means exceeding said minimum value by a pre-selected amount.

2. The apparatus of claim 1 which further includes electronic filter means connected in circuit between said electronic circuit means and said electronic comparison means for removing extraneous noise signal components.

3. The apparatus of claim 1 wherein the value of said high impedance resistor is 1000 megohms.

4. The apparatus of claim 1 which further includes:
   a wave shaping circuit, connected to said source of alternating current, for generating a first output pulse in response to the positive peak of said alternating current and a second output pulse in response to the negative peak of said alternating current, said output pulses being transmitted to said electronic circuit means.

5. The apparatus of claim 4 wherein said first electronic means includes a trigger circuit response to said first output pulse to initiate said signal sampling.

6. The apparatus of claim 4 wherein said second electronic means includes a trigger circuit responsive to said second output pulse to initiate said signal sampling.

7. A method for detecting the presence of an article adjacent to a metallic sensing element which comprises the steps of:
   furnishing an alternating current to a resistor having one side thereof connected to said sensing element;
   inducing a current in said resistor as a result of a capacitive coupling of said article and said sensing element;
   electronically generating a signal quantity representative of the peak to peak voltage across said resistor resulting from said induced current;
   electronically sampling and holding a value representative of the minimum peak to peak voltage across said resistor during periods when no article is present;
   electronically comparing said value representative of said minimum voltage and said signal quantity representative of the peak to peak voltage; and
   generating an output signal indicating the presence of an article if said signal exceeds said value representative of said minimum voltage by a pre-selected amount.

* * * * *